United States Patent [19]

Liu

[11] 3,924,229

[45] Dec. 2, 1975

[54] BIPOLAR DIGITAL TO ANALOG CONVERTER UTILIZING TWO REFERENCE VOLTAGES OF THE SAME POLARITY

[75] Inventor: Chung C. Liu, San Jose, Calif.

[73] Assignee: International Business Machines Corporation, New York, N.Y.

[22] Filed: Mar. 9, 1971

[21] Appl. No.: 122,504

Related U.S. Application Data

[63] Continuation of Ser. No. 790,224, Jan. 10, 1969, abandoned.

[52] U.S. Cl. .......................................... 340/347 DA

[51] Int. Cl.² .......................................... H03K 13/04

[58] Field of Search ........... 340/347 DA, 297, 22 Z, 340/267

[56] References Cited

UNITED STATES PATENTS

| | | | |
|---|---|---|---|
| 3,403,393 | 4/1968 | Skrenes | 340/347 DA |
| 3,475,749 | 10/1969 | Plice | 340/347 DA |
| 3,540,037 | 11/1970 | Ottesen | 340/347 DA |
| 3,544,994 | 12/1970 | Hanson et al. | 340/347 DA |
| 3,585,633 | 6/1971 | Young | 340/347 AD |

OTHER PUBLICATIONS

Stephenson, "A–D Conversion Handbook," 3/1964, pp. 1, 2, 51, 67.

*Primary Examiner*—Thomas J. Sloyan
*Attorney, Agent, or Firm*—Otto Schmid, Jr.

[57] ABSTRACT

A digital to analog converter wherein an operational amplifier having an inverting input terminal, a non-inverting input terminal and an output terminal is provided with a feedback impedance element coupled between the amplifier output terminal and the inverting input terminal and a binary weighted resistor network comprising a plurality of resistors each of which has one end coupled to the inverting input terminal of the amplifier. The other end of the resistors are each coupled through selectively operable single-pole-single-throw switching means to a reference potential. A first reference voltage is coupled to the non-inverting input terminal of the amplifier, and a second reference voltage is coupled through a reference impedance means to the inverting input terminal of the amplifier. This circuit provides complete isolation between the reference voltage supply and the weighted resistor network so that the load current from the reference supply is constant regardless of the state of the switching means. The switching means are energized according to the digital values of the digital input signal so that an analog signal proportional to the digital input signal is produced at the output terminal of the amplifier. A bipolar output is produced with the use of two reference voltage sources of the same polarity.

3 Claims, 5 Drawing Figures

*INVENTOR*
CHUNG C. LIU
*BY* Otto Schmid, Jr.
ATTORNEY

BIPOLAR DIGITAL TO ANALOG CONVERTER UTILIZING TWO REFERENCE VOLTAGES OF THE SAME POLARITY

CROSS-REFERENCE TO RELATED APPLICATIONS

This application is a continuation of application Ser. No. 790,224, filed Jan. 10, 1969, now abandoned.

BACKGROUND OF THE INVENTION

1. Field of the Invention

This invention relates to a digital to analog converter, and more particularly to a digital to analog converter which utilizes an operational amplifier and a weighted resistor network.

2. Description of the Prior Art

The rapid expansion of low cost digital data processing equipment into the areas of process control and data acquisition systems has created a need for low cost systems for the conversion of digital data to analog data for use in further computations, for oscilliscope display, for analog plotting and for the utilization of signals to control physical processes. A digital to analog converter (DAC) converts the digital signals utilized in process control computers to an analog signal capable of providing some control function. Due to the use of the DAC with a computer, it is desirable to provide the conversion at as fast a speed as possible, while at the same time providing great accuracy and reliability in the conversion operation. Prior art electronic digital to analog converters having high accuracy and high speed of operation have required relatively expensive components. Generally, the prior art DACs of this type require a single-pole-double-throw transistor switch for each input bit and a complementary NPN-PNP precision transistor pair is usually required to perform this switching function. The switches in the prior art DACs function to connect their respective weighting resistors either to the reference voltage source or to ground potential depending on the input digital data. Therefore, the reference voltage supply must not only provide a precise voltage but must also absorb the load current of half the number of switching transistors. This heavy load variation demands a sophisticated reference voltage supply design especially when several DACs share the same reference supply. In addition, the prior art DACs generally require two reference voltage supplies of opposite polarity to obtain a bipolar output.

It is therefore a primary object of this invention to provide an improved digital to analog converter of the type which utilizes an operational amplifier and a weighted resistor network which is capable of operating at relatively high speed with a high degree of accuracy.

It is a further object of this invention to provide an improved analog to digital converter which utilizes a much simpler switching arrangement which results in a much less costly circuit.

It is another object of this invention to provide an improved digital to analog converter having a greatly simplified reference voltage source.

SUMMARY OF THE INVENTION

Briefly, according to the invention, there is provided a digital to analog converter (DAC) comprising an operational amplifier having a non-inverting input terminal, an inverting input terminal and an output terminal.

An impedance means is coupled between the output terminal of the amplifier and the inverting input terminal of the amplifier to provide a feedback path, and a weighted resistor network is provided comprising a plurality of resistors each having one end coupled to the inverting terminal of the amplifier and having the other end coupled through a switching means to a reference potential. A first reference voltage is coupled to the non-inverting terminal of the amplifier and a second reference voltage is coupled through a reference impedance to the inverting input terminal of the amplifier. Means are provided to selectively actuate the switching means responsive to the digital input signals whereby an analog signal having a magnitude proportional to the digital input signal is provided at the output terminal of the amplifier.

According to an embodiment of the invention wherein an output in current form is provided, the digital to analog converter comprises an amplifier having a non-inverting input terminal, an inverting input terminal and an output terminal. The load impedance is coupled between the output terminal and the inverting input terminal of the amplifier to provide a feedback path, and a weighted resistor network is provided comprising a plurality of resistors each having one end coupled to the inverting terminal of the amplifier and having the other end coupled through a switching means to a reference potential. A first reference voltage is coupled to the non-inverting terminal of the amplifier to provide positive output signals and an additional reference voltage is coupled through a switch and a reference impedance to the inverting input terminal of the amplifier to provide negative output signals. Means are provided to selectively actuate the switching means responsive to the digital input signals whereby an analog current signal having a magnitude proportional to the digital input signal is provided at the output terminal of the amplifier.

According to another embodiment of the invention wherein a DAC with a bipolar output can be accomplished utilizing only one reference voltage, a second operational amplifier is connected as a differential amplifier which performs summing and subtraction operations. The output of the first amplifier is fed through a resistor divider to the non-inverting input terminal of the second amplifier. The reference voltage source is coupled to the non-inverting input terminal through two separate paths. One path is directly through a resistor while the second path is through a switch which has two possible positions depending on the polarity of the input digital data. Thus, conversion of bipolar input signals can be easily accomplished on a selective basis by the use of this embodiment of the invention.

Thus, it can be seen that there is provided an improved DAC which utilizes a simple switch configuration. This circuit provides complete isolation of the reference voltage supply from the weighted resistor network so that the load current from the reference supply is constant regardless of the state of the voltage switches. The constant load current from the reference voltage supply not only eases the load regulation requirement of the supply, but also enhances the speed response of the converter. In addition, bi-polar output signals can be obtained from reference voltage supplies of the same polarity.

The foregoing and other objects, features and advantages of the invention will be apparent from the following more particular description of a preferred embodiment of the invention as illustrated in the accompanying drawings.

DESCRIPTION OF PREFERRED EMBODIMENTS OF THE INVENTION

Figure 1:
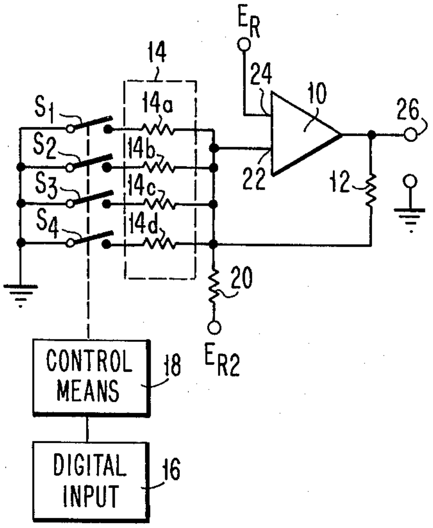
FIG. 1 is a diagrammatic schematic view of a digital to analog converter embodying the invention.

Referring to the drawings, a digital to analog converter is shown comprising an operational amplifier 10 having a feedback impedance means 12 coupled from the output terminal of amplifier 10 to a first input terminal of amplifier 10. A weighted resistor network 14 comprising a plurality of resistors is provided. In the embodiments of the invention shown in the drawings only four resistors are shown for convenience. However, it will be recognized that the actual number of parallel resistance summing paths is a matter of choice depending upon the resolution desired. The larger the number of parallel resistance paths that are provided in network 14, the finer the resolution of the converter becomes. One end of each of the resistors is coupled to the first input terminal of amplifier 10 and the other end of each of the resistors is coupled to a reference potential when the resistor is selected by the corresponding one of switching means $S_1$, $S_2$, $S_3$, $S_4$. A data input means 16 is provided to couple suitable digital data input signals to the DAC. Control means 18 provides suitable control signals to operate the DAC. One control signal selectively gates the digital input signals to close corresponding ones of switches $S_1$, $S_2$, $S_3$, $S_4$ that correspond to the values of the digital input signal to couple the corresponding resistor of network 14 to the reference potential which is ground potential in the embodiment shown. A reference voltage source $E_R$ is coupled to a second input terminal of the amplifier. A second reference voltage source $E_{R2}$ of the same polarity as the reference source $E_R$ is coupled through a reference impedance means 20 to the first input terminal of the amplifier. The result of the operation of this circuit is an analog signal at the output terminal of amplifier 10 having a magnitude proportional to the digital input signal. In a particular embodiment of my invention comprising a 10 bit DAC, a conversion time of 10 microseconds and an accuracy of .1% of full scale was obtained.

It can be shown that, for the circuit just described, the output voltage $V_o$ of the converter is as follows:

$$V_o = E_R\left(1 + \frac{R_F}{R_A} - C\,\frac{R_F}{R_A}\right) + \sum_{K=1}^{n} E_R A_K \frac{R_F}{2^K R} \quad (1)$$

where:

$E_R$ = reference voltage, $C$ = a positive constant, $A_K$ = the possible switch states as determined by the input digital data. When $A_K = 1$, the K-th switch is closed. When $A_K = 0$, the K-th switch is open.

$2^K R$ = value of resistors in network 14,

$R_F$ = feedback impedance means 12,

$R_A$ = reference impedance means 20,

$n$ = number of bits of the input digital data.

By choosing the value of $R_F$ and $R_A$ to be equal and by choosing the constant C to be 2, ($2E_R = E_{R2}$) equation (1) becomes $$V_o = \sum_{K=1}^{n} E_R A_K \frac{R_F}{2^K R} \quad (2)$$

Equation (2) represents a unipolar output with a resolution of $n$ bits.

The value of $R_F$ can be chosen equal to $2R_A$ and the constant C can be chosen to be 2 in equation (1) to produce the following relationship:

$$V_o = -E_R + \sum_{K=1}^{n} E_R A_K \frac{R_F}{2^K R} \quad (3)$$

Equation (3) represents a bipolar output with a resolution of ($n$−1) bits. In this case the most significant bit becomes the sign bit. Both equations (2) and (3) are true representations of a binary coded digital data in their respective analog voltage form. Thus, it can be seen that either a unipolar or bipolar DAC can be provided by selecting the proper ratio of the feedback impedance means $R_F$ and the reference impedance means $R_A$.

In the embodiment of the invention shown in FIG. 1, amplifier 10 comprises an operational amplifier having a first inverting input terminal 22, a second non-inverting terminal 24 and an output terminal 26. In the embodiment shown feedback impedance means 12 comprises a resistive impedance coupled between the output terminal 26 of amplifier 10 and inverting input terminal 22. In the embodiment shown a first reference voltage source $E_R$ is coupled to non-inverting input terminal 24 of amplifier 10. A second reference voltage source $E_{R2}$ is coupled through reference impedance means 20 to inverting input terminal 22 of amplifier 10. In the embodiment shown the reference impedance means comprises a resistive impedance. Also coupled to inverting input terminal 22 of amplifier 10 is one end of each of a plurality of resistors comprising weighted resistor network 14. The value of successive resistors $14_a$, $14_b$, $14_c$, $14_d$ comprising weighted resistor network 14 vary according to a binary weight in the embodiment shown with resistor 14a having a value of 2R, resistor 14b having a value of 4R, etc. It will be recognized by those skilled in the art that the resistor values of network 14 may vary according to any other suitable code. The other end of the resistors comprising network 14 is coupled to a switching means $S_1$, $S_2$, $S_3$, $S_4$ which is selectively actuable to couple the corresponding resistor to a reference potential in response to the corresponding bit of a digital input signal from digital input source 16. Although switches $S_1$, $S_2$, $S_3$, $S_4$ are shown as being coupled on the ground potential end of resistors $14_a$, $14_b$, $14_c$, $14_d$, it will be clear that the switches can as well be placed between the other end of network 14 and terminal 22 of amplifier 10. Control means 18 produces signals operative to gate corresponding bits of the input digital signal to selectively close switches $S_1$, $S_2$, $S_3$, $S_4$. For those bits for which a "one" is present in the digital input signal, the switch is turned ON to couple the corresponding resistor $14_a$, $14_b$, $14_c$, $14_d$ to the reference potential which in the embodiment shown comprises ground potential. For those bits for which a "zero" is present in the digital input signal, the corresponding switch $S_1$, $S_2$, $S_3$, $S_4$ is turned OFF so that the corresponding resistor $14_a$, $14_b$, $14_c$, $14_d$ is inactive in the conversion.

To provide a specific numeric example of the conversion for the embodiment of the invention shown in FIG. 1, assume the following component values:

| | |
|---|---|
| Resistor $14_a$ | 1000 OHMS |
| Resistor $14_b$ | 2000 OHMS |
| Resistor $14_c$ | 4000 OHMS |
| Resistor $14_d$ | 8000 OHMS |
| Resistor 12 ($R_F$) | 1000 OHMS |
| Resistor 20 ($R_A$) | 500 OHMS |
| Voltage source $E_R$ | 4 VOLTS |
| Voltage source $E_{R2}$ | 8 VOLTS |

With all switches open as shown, the output at terminal 26 due to reference $E_R$ is $E_R$.

$$\frac{R_F + R_A}{R_A} = 12 \text{ volts.}$$

The output due to the second reference voltage $E_{R2}$ is $$-E_{R2}\ \frac{R_F}{R_A} = -16 \text{ volts}$$

since $E_{R2}$ is coupled to the inverting input terminal 22. Therefore, the resultant output voltage is −4 volts. It is noted that the current flowing in the feedback resistance 12 is 8 milliamperes in the direction from terminal 22 to terminal 26. This current remains constant and is supplied by the second voltage reference supply $E_{R2}$.

By closing selected ones of switches $S_1$, $S_2$, $S_3$, $S_4$, additional currents are drawn from amplifier 10 according to the binary weighted resistance values. For example, when $S_1$ is closed, it draws $E_R/R_{14a}$ or 4 milliamperes — 2 milliamperes when $S_2$ is closed — 1 milliampere when $S_3$ is closed — 0.5 milliampere when $S_4$ is closed. These currents are from amplifier output terminal 26, through resistor 12, through selected resistors 14, closed switches $S_1 - S_4$ to ground. These currents are sensed by resistor 12 and result in amplifier output voltage changes. These voltage changes are also binary weighted. When switch $S_1$ is closed the incremental voltage is $$E_R\ \frac{R_F}{R_{14a}} = 4 \text{ volts,}$$

— when switch $S_2$ is closed, 2 volts — when switch $S_3$ is closed, 1 volt and when $S_4$ is closed, 0.5 volts. It has been shown above that the summation of the current as a result of the resistor switching provides at the output terminal of amplifier 10 an analog signal which is proportional to the digital input signal coupled to selectively actuate the switching means. Table I below shows the output voltage at terminal 26 of the converter shown in FIG. 1 for all possible bit combinations of the digital input data. For an input bit "0" the corresponding switch is open, and for a "1" the corresponding switch is closed.

TABLE I

| Input Bit $S_1$ | $S_2$ | $S_3$ | $S_4$ | Output $V_o$ (Volts) |
|---|---|---|---|---|
| 0 | 0 | 0 | 0 | −4.0 |
| 0 | 0 | 0 | 1 | −3.5 |
| 0 | 0 | 1 | 0 | −3.0 |
| 0 | 0 | 1 | 1 | −2.5 |
| 0 | 1 | 0 | 0 | −2.0 |
| 0 | 1 | 0 | 1 | −1.5 |
| 0 | 1 | 1 | 0 | −1.0 |
| 0 | 1 | 1 | 1 | −0.5 |
| 1 | 0 | 0 | 0 | 0 |
| 1 | 0 | 0 | 1 | +0.5 |
| 1 | 0 | 1 | 0 | +1.0 |
| 1 | 0 | 1 | 1 | +1.5 |
| 1 | 1 | 0 | 0 | +2.0 |
| 1 | 1 | 0 | 1 | +2.5 |
| 1 | 1 | 1 | 0 | +3.0 |
| 1 | 1 | 1 | 1 | +3.5 |

Figure 4:
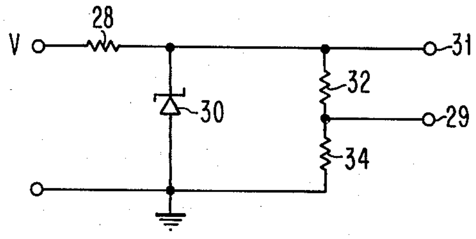
FIG. 4 is a schematic diagram of an embodiment of the reference voltage source used in the DAC comprising the invention.

One of the most expensive components of a DAC is the reference voltage source due to the load regulation and the accuracy that are required. My invention greatly simplifies the design of the reference voltage source due to the isolation of this source from the weighted resistor network in the circuit. Referring to FIG. 4, the simple reference voltage supply comprises an unregulated voltage supply V which is coupled through a resistor 28 across a zener diode 30 to ground potential. A pair of precision matched resistors 32, 34 are coupled across zener diode 30. Resistors 32, 34 have values which are chosen to provide the desired ratio between $E_R$ and $E_{R2}$. In the embodiment shown $E_{R2}$ is twice $E_R$ so that resistors 32, 34 are equal in value. Terminal 29 is provided between resistors 32, 34 to provide source $E_R$ and terminal 31 at the other end of resistor 32 provides source $E_{R2}$. Thus, it can be seen that a simplified reference voltage source is provided since in equivalent prior art DACs a voltage regulator is usually required to provide the required load regulation for the reference voltage supply.

Figure 5:
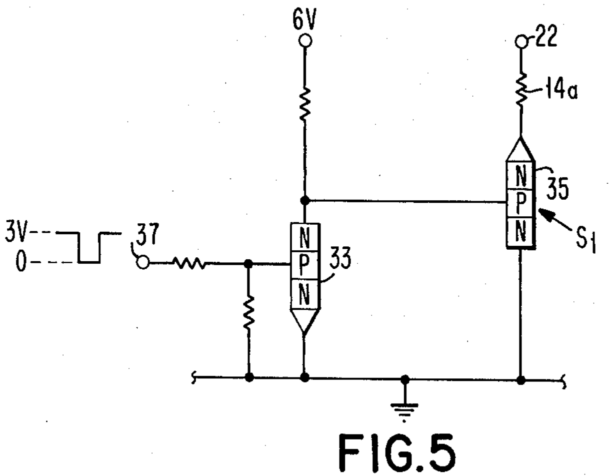
FIG. 5 is a schematic diagram of an embodiment of the voltage switching means used in the DAC comprising the invention.

My DAC circuit provides the advantage that only one single-pole-single-throw switch per each bit of the input digital signal is required. In addition, the switch is ground referenced so that the design of the switching circuit is simplified to the extent that a single transistor can provide the switching function. Prior art DACs require a complementary matched pair of voltage switching transistors for each bit of the input digital data. Thus it can be seen that my DAC provides a saving of n voltage switching transistors for an n-bit DAC. This is an important saving since these transistors are one of the most expensive components of a DAC. A switching means suitable for use as switches $S_1$, $S_2$, $S_3$, $S_4$ in my DAC is shown in FIG. 5. The switching means comprises a driver transistor 33 and a voltage switching transistor 35. Transistor 35 may comprise a field effect or a bipolar transistor. Transistor 35 is coupled in the inverted mode to provide a low resistance and a low offset voltage when the transistor is turned ON. A signal derived from the digital data source 16 is coupled to input terminal 37. An up level signal turns ON transistor 33 which holds transistor 35 OFF. A down level signal at terminal 37 turns OFF transistor 33 and turns transistor 35 ON to couple the corresponding resistor 14 to ground potential and thereby add the corresponding analog voltage value to the amplifier output terminal. The switch $S_1$ for resistor $14_a$ is shown in FIG. 5 and a similar switch is required for each bit of the digital input data.

Many of the actuators and electronic instruments used in the process control industries require a d.c. signal in current form as the control input. To provide a current output when using a conventional DAC, a voltage-to-current conversion stage is generally required since the DAC output is generally in voltage form.

Figure 2:
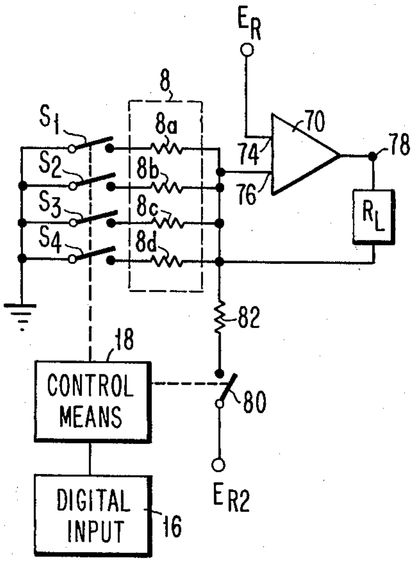
FIG. 2 is a diagrammatic schematic view of a digital to analog converter with current output embodying the invention.

The embodiment of the invention shown in FIG. 2 functions to integrate the functional characteristics of both a DAC and a voltage-to-current converter into one single circuit. Bipolar operation is provided while using two voltage reference sources of the same polarity. This embodiment of the DAC comprises an operational amplifier 70 having a non-inverting input terminal 74, an inverting input terminal 76 and an output terminal 78. The load impedance means $R_L$ is coupled from output terminal 78 of amplifier 70 to inverting input terminal 76. A binary weighted resistor network 8 is coupled in the circuit so that one end of each of the resistors of the network is coupled to inverting terminal 76 of amplifier 70. The other end of each of the resistors $8_a$, $8_b$, $8_c$, $8_d$ is coupled to one of a plurality of switching means $S_1$, $S_2$, $s_3$, $S_4$. A source of digital input signals 16 is coupled through control means 18 to selectively close corresponding ones of switches $S_1$, $S_2$, $S_3$, $S_4$ to couple the corresponding resistor to the reference potential such as ground potential. The reference voltage $E_R$ is connected to the non-inverting input terminal 74 of amplifier 70. Reference voltage $E_{R2}$ is coupled through switch 80 and reference impedance 82 to inverting input terminal 76 of amplifier 70. Switch 80 is selectively operated according to the sign of the digital input signal. For positive signals switch 80 is open and for negative signals switch 80 is closed so that voltage source $E_{R2}$ is active in the conversion. The general expression for output current $I_o$ for any input bit combinations is as follows:

$$I_o = -A_o \frac{E_R\,(C-1)}{R_A} + \sum_{K=1}^{n} A_K \frac{E_R}{2^K R} \qquad (4)$$

where $A_o$ = state of the sign switch 80, when $A_o = 0$, the sign switch is open and is for positive output. When $A_o = 1$, the sign switch is closed and is for negative output.

$E_R$ = reference voltage source, $R_A$ = reference impedance means 82,

$A_K$ = the possible switch states as determined by the input digital data. When $A_K = 1$, the $K$-th switch is closed. When $A_K = 0$, the $K$-th switch is open.

$C$ = a positive constant, $2^K R$ = value of resistors in network 8.

The output impedance of the converter is relatively high due to the current feedback technique. The output impedance, $R_o$, is approximately equal to $$R_o = A_{oL} \times R_n \qquad (5)$$

where $A_{oL}$ = open loop gain of amplifier 70;

$R_n$ = equivalent parallel resistance between terminal 76 and ground. Thus, it can be seen that bipolar operation is provided depending on the position of sign switch 80. As in other modes of operation, the digital input signal is coupled to switches $S_1$, $S_2$, $S_3$, $S_4$, and the state of the switches are either closed or open depending on the corresponding bits of the digital data input. The switch means are selectively switched according to the digital input data so that there is provided to the load a current the magnitude of which is proportional to the digital input signal. The majority of electronic actuators and instruments used today in the process industries require only a positive current output. In this case, reference source $E_{R2}$, sign switch means 80 and reference impedance means 82 can be omitted.

This embodiment possesses the same advantages as the previously described embodiment relative to the isolation of the reference source from the voltage switch registers and the resistor network and the simple SPST switch. In addition, the simple SPST switch is also utilized. This construction enhances converter speed and simplifies the design of the reference voltage source and the voltage switch registers.

Figure 3:
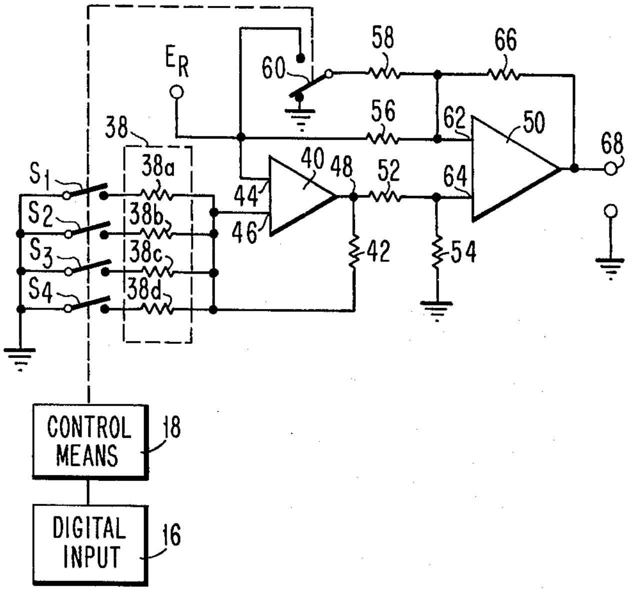
FIG. 3 is a diagrammatic schematic view of an alternate embodiment of the digital to analog converter embodying the invention wherein bipolar operation is obtained from a single reference voltage source.

The embodiment of the invention shown in FIG. 3 functions to provide bipolar operation while using only one voltage reference source. This embodiment of the DAC comprises an operational amplifier 40 having a non-inverting input terminal 44, an inverting input terminal 46 and an output terminal 48. A feedback impedance means 42 is coupled from output terminal 48 of amplifier 40 to inverting input terminal 46. A binary weighted resistor network 38 is coupled in the circuit so that one end of each of the resistors of the network is coupled to inverting terminal 46 of amplifier 40. The other end of each of the resistors $38_a$, $38_b$, $38_c$, $38_d$ is coupled to one of a plurality of switching means $S_1$, $S_2$, $S_3$, $S_4$. A source of digital input signals 16 is coupled through control means 18 to selectively close corresponding ones of switches $S_1$, $S_2$, $S_3$, $S_4$ to couple the corresponding resistor to the reference potential. The reference voltage $E_R$ is connected to the non-inverting input terminal 44 of amplifier 40.

The output voltage $e_1$ at output terminal 48 of amplifier 40 can be shown to be $$e_1 = E_R + \sum_{K=1}^{n} E_R A_K \frac{R_F}{2^K R} \qquad (6)$$

where $E_R$ = reference voltage, $A_K$ = the possible switch states as determined by the input digital data. When $A_K = 1$, the K-th switch is closed. When $A_K = 0$, the K-th switch is open.

$R_F$ = feedback impedance means 42,

$2^K R$ = value of resistor in network 38.

A second operational amplifier 50 is provided and is connected as a differential amplifier. The output of amplifier 40 is coupled to a divider network comprising resistors 52, 54 to the non-inverting input terminal 64 of amplifier 50. Resistor 52 has a value of R and resistor 54 has a value of R/2. Resistors 56, 58 and 66 also have a value of R. Resistor 66 comprises a feedback path from output terminal 68 to input terminal 62 of amplifier 50. The reference voltage $E_R$ is coupled to the inverting input terminal 62 of amplifier 50 in two separate paths. One path comprises a direct connection of reference potential $E_R'$ through resistor 56 to inverting terminal 62 of amplifier 50. The second path for reference voltage $E_R$ comprises resistor 58 and switch 60. Switch 60 is a sign switch and is set in accordance with the sign bit of the digital input signal to provide bipolar operation of the DAC. When switch 60 is in the position shown in the drawings, the voltage at the output terminal 68 of amplifier 50 is positive. When switch 60 is in the other position the output voltage from amplifier 50 is negative. When switch 60 is in the position shown in the drawing the output voltage $e_o$ at terminal 68 of amplifier 50 is equal to the difference of the two inputs $e_1$ at terminal 48 and the reference voltage $E_R$ since amplifier 50 is connected as a conventional differential amplifier.

$$e_o = e_1 - E_R \quad (7)$$

Substituting equation (6) into (7) yields $$e_o = \sum_{K=1}^{n} E_R A_K \frac{R_F}{2^K R} \quad (8)$$

When switch 60 is in the opposite state from that shown in the drawings, this connects the reference voltage $E_R$ through resistor 58 to amplifier 50 as a third input. This addition contributes another term of $-E_R$ to the amplifier output to produce:

$$e_o = -E_R + \sum_{K=1}^{n} E_R A_K \frac{R_F}{2^K R} \quad (9)$$

Equations (8) and (9) are true representations of a binary coded digital input data in their respective analog voltage form. Equation (8) provides the output for a positive signal and equation (9) is for a negative output. The input data for a negative output should be in 2's complement form.

Thus, it can be seen that there is provided a DAC which provides a bipolar output with only a single reference source. This embodiment possesses the same advantages as the previously described embodiments relative to the isolation of reference source from the voltage switch registers and the resistor network and a simple SPST switch is utilized. This construction enhances converter speed and simplifies the design of the reference voltage source and the voltage switch registers.

It will be recognized by those skilled in the art that a successive approximation ADC can be easily constructed from my new DAC. This is accomplished by coupling the output of the DAC to one input of a comparator and an unknown voltage to the other input to the comparator. The output of the comparator is coupled by means of suitable logic control circuits to the digital signal input of the DAC and successive approximations are made in this manner until the desired precision is obtained.

While the invention has been particularly shown and described with reference to a preferred embodiment thereof, it will be understood by those skilled in the art that various changes in the form and details may be made therein without departing from the spirit and scope of the invention.

What is claimed is:

1. A digital to analog converter for producing an analog signal proportional to the magnitude of a digital input signal comprising:

an amplifier having a first and a second input terminal and an output terminal;

a load impedance means coupled from said output terminal to said first input terminal of said amplifier;

a reference impedance means connected directly to said first input terminal of said amplifier;

first switch means including a plurality of single pole single throw switch means;

a plurality of weighted resistors;

means for coupling a plurality of branch circuits in parallel between said first input terminal of said amplifier and a reference potential; each of said branch circuits comprising one of said single pole single throw switch means and one of said weighted resistors in series;

means coupled to each of said single pole single throw switch means for energizing said switches according to the digital values of said digital input signal to select the corresponding one of said plurality of resistors;

a first and a second reference voltage;

means for coupling said first reference voltage to the second input terminal of said amplifier;

a second reference voltage of the same polarity as said first reference voltage wherein the magnitude of said reference voltages differs by a constant factor;

second switch means for selectively coupling said second reference voltage directly through said reference impedance means to said first input terminal of said amplifier; and means for selectively operating said second switch means according to the sign of said digital input signal so that an analog current signal proportional to the magnitude of said digital input signal is produced at said output terminal of said amplifier.

2. The digital to analog converter according to claim 1 wherein said weighted resistors are weighted according to a binary code.

3. The digital to analog converter according to claim 1 wherein said single pole switch means comprises a single transistor coupled in series with the corresponding weighted resistor between said reference potential and said first input terminal of said amplifier.

* * * * *